US006939800B1

(12) United States Patent
Lu et al.

(10) Patent No.: US 6,939,800 B1
(45) Date of Patent: Sep. 6, 2005

(54) DIELECTRIC BARRIER FILMS FOR USE AS COPPER BARRIER LAYERS IN SEMICONDUCTOR TRENCH AND VIA STRUCTURES

(75) Inventors: Hong-Qiang Lu, Gresham, OR (US); Peter A. Burke, Portland, OR (US); Wilbur G. Catabay, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 2 days.

(21) Appl. No.: 10/321,938

(22) Filed: Dec. 16, 2002

(51) Int. Cl.[7] .......................................... H01L 21/4763

(52) U.S. Cl. ...................... 438/643; 438/653; 438/687; 438/761

(58) Field of Search ................................ 438/623, 643, 438/653, 761, 763, 786, 687

(56) References Cited

U.S. PATENT DOCUMENTS 6,159,871 A * 12/2000 Loboda et al. .............. 438/786
6,365,527 B1 * 4/2002 Yang et al. ................. 438/761
6,794,311 B2 * 9/2004 Huang et al. ............... 438/761
2002/0140101 A1 * 10/2002 Yang et al. ................ 257/762

* cited by examiner

*Primary Examiner*—Wael Fahmy
*Assistant Examiner*—Ginette Peralta
(74) *Attorney, Agent, or Firm*—Beyer Weaver & Thomas, LLP

(57) ABSTRACT

The present invention is directed to improved dielectric copper barrier layer and related interconnect structures. One structure includes a semiconductor substrate having a copper line. An insulating layer formed of at least one of silicon and carbon is formed on the underlying copper line. An opening is formed in the insulating layer to expose a portion of the copper line. The inner surface of the opening in the insulating layer has a dielectric barrier layer formed thereon to prevent the diffusion of copper into the insulating layer. A copper plug is formed to fill the opening and make electrical contact with the underlying copper interconnect structure. Aspects of the invention also include methods for forming the dielectric copper barrier layers and associate copper interconnects to the underlying copper lines.

7 Claims, 4 Drawing Sheets

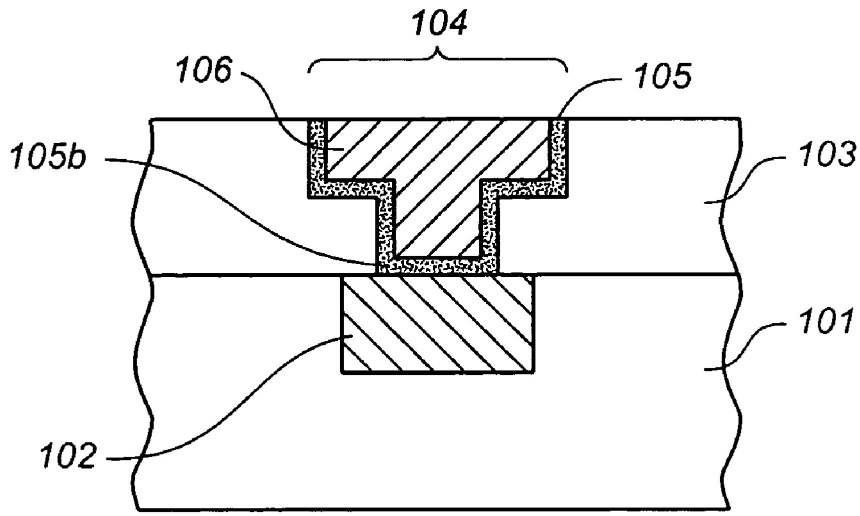
FIG._1
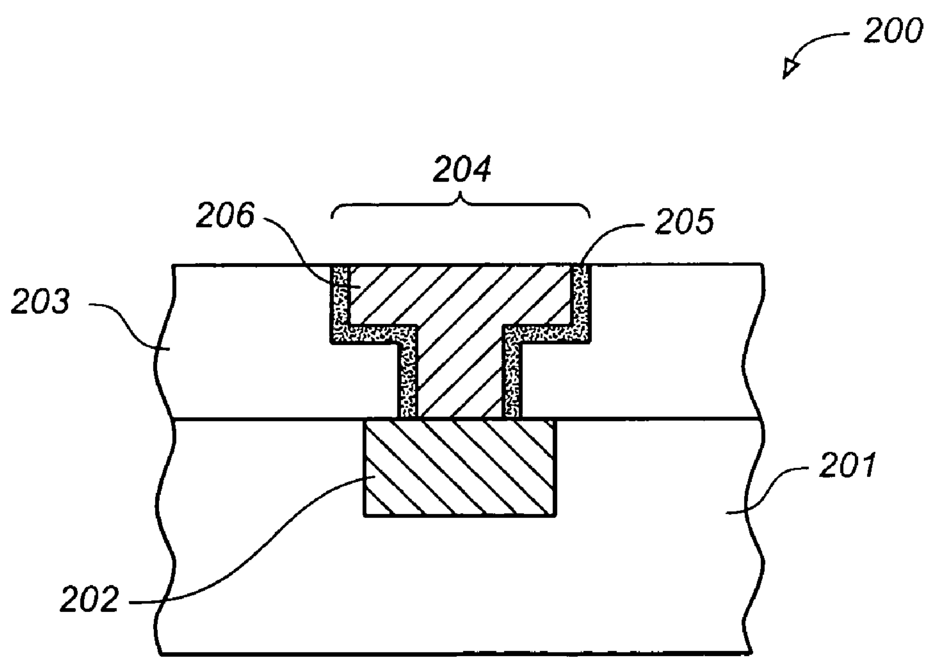
FIG._2

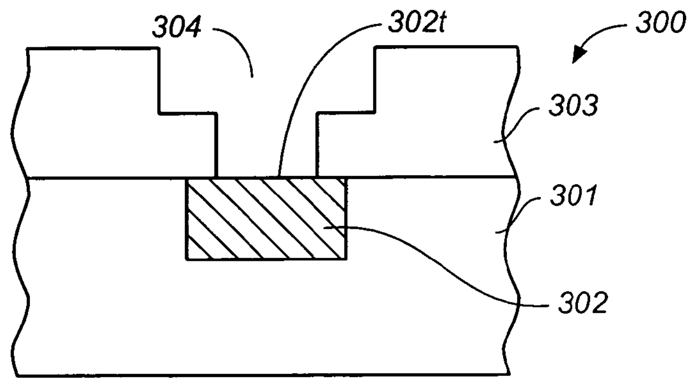
FIG._3a
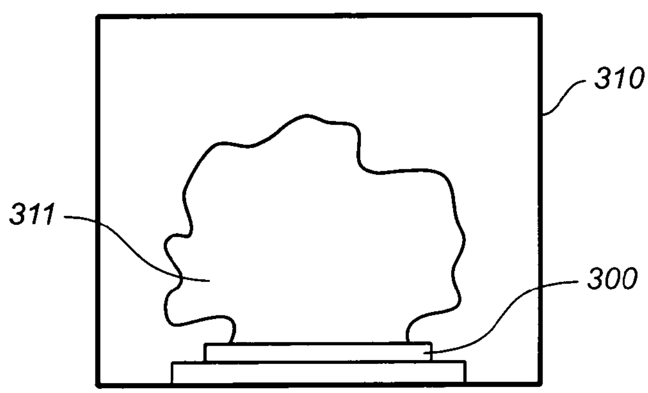
FIG._3b
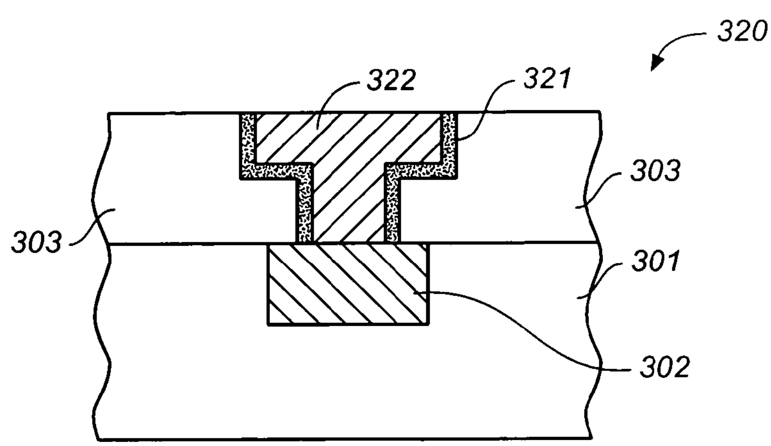
FIG._3c

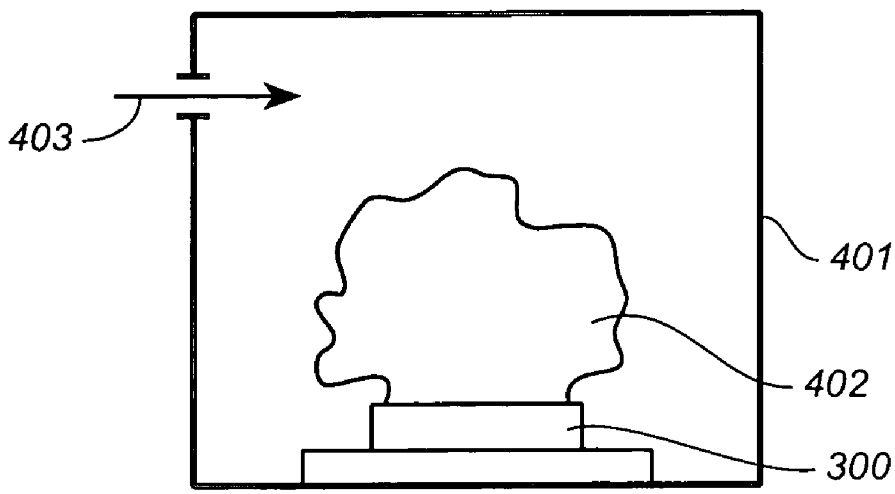
FIG._4a
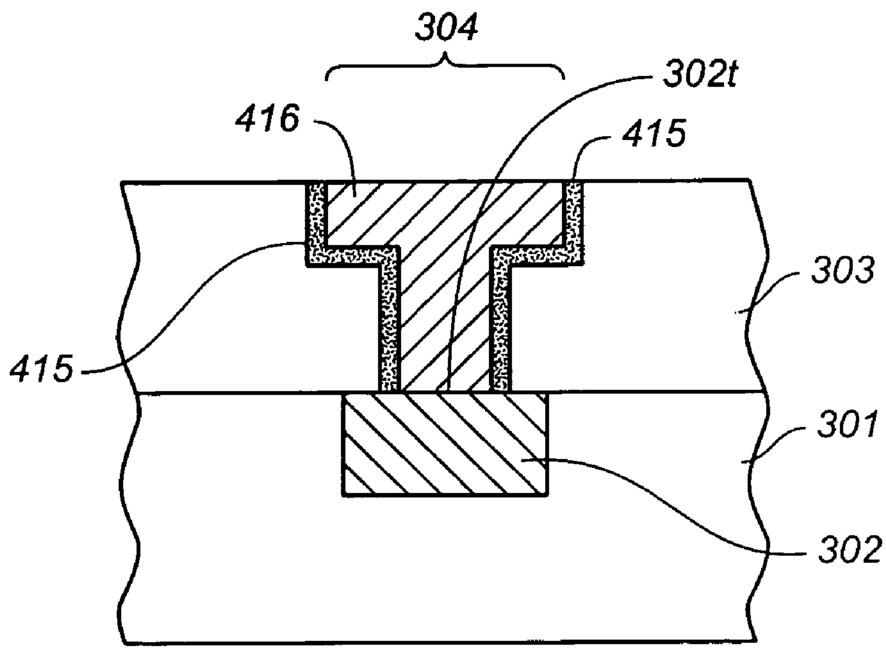
FIG._4b

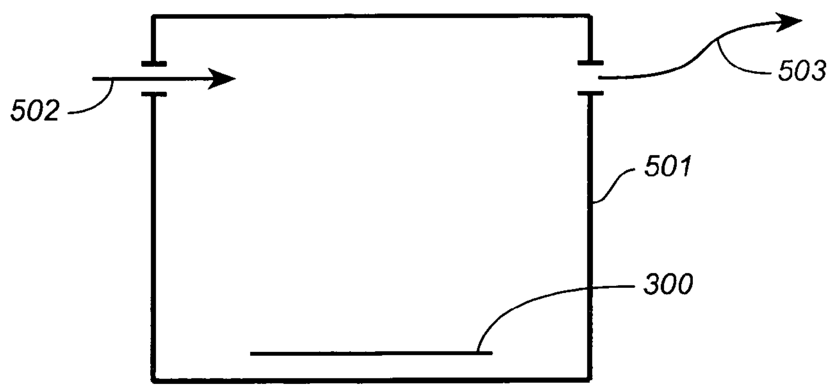
FIG._5a
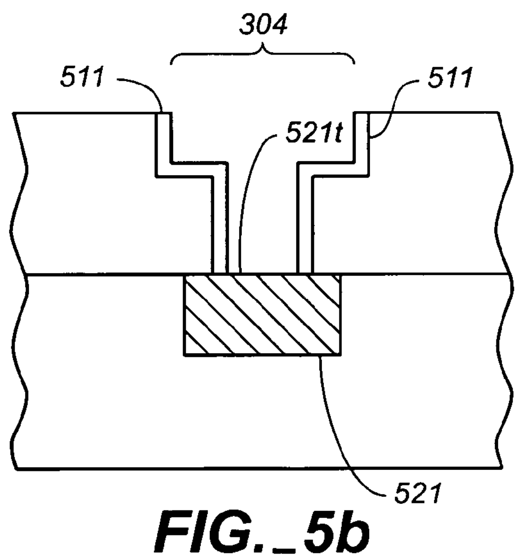
FIG._5b
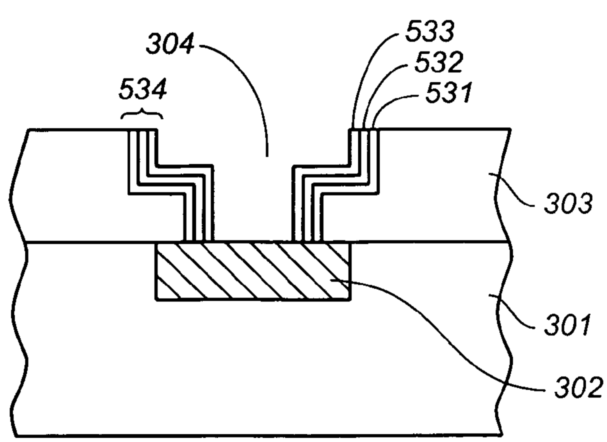
FIG._5c

DIELECTRIC BARRIER FILMS FOR USE AS COPPER BARRIER LAYERS IN SEMICONDUCTOR TRENCH AND VIA STRUCTURES

FIELD OF THE INVENTION

The invention described herein relates generally to semiconductor devices and processing. In particular, the present invention relates to methods, materials, and structures used in forming dielectric barrier films used with copper materials in trench and via structures. More particularly, the invention relates to methods, materials, and structures for forming dielectric barrier films used with copper materials in damascene and dual damascene semiconductor processes.

BACKGROUND OF THE INVENTION

In recent years, copper materials have found increasing use in semiconductor manufacturing technologies. Such methods commonly include the so-called damascene and dual-damascene manufacturing processes. Generally, such processes generally involve forming openings in a process layer, filling the layer with copper, and then planarizing the surface to complete the process. In one common implementation, such damascene (and dual damascene) processes are used to interconnect the metallization layers of multi-layer semiconductor structures.

Briefly, a metallization layer is formed on a semiconductor substrate (e.g. a wafer or semiconductor die) in accordance with metallization processes known in the art. The metallization layer includes patterns of circuit paths and electrical connections. In multi-layer structures, the circuit patterns of one metallization layer are electrically connected to circuit patterns formed on other metallization layers formed above and below the layer in question. Typically, the metallization layers are separated by one or more layers of dielectric material. These intervening layers are collectively referred to as the inter-layer dielectric (ILD) layer. Electrical interconnections between the metallization layers are commonly made by forming vias through the ILD, and filling the vias with copper materials.

As is known to those having ordinary skill in the art, when copper materials are used, metal barrier layers are needed to prevent copper from diffusing into the ILD layer and "poisoning" the ILD. Commonly, such metal barrier materials comprise metals or metal compounds (e.g., TiN, TaN, and other metal containing barrier materials). Such materials form excellent barriers to copper diffusion. FIG. 1 illustrates one particular application of conventional metal barrier layers as currently used. The depicted structure is a cross-section schematic view of a portion of a semiconductor substrate. A copper conducting line 102 of the metallization layer is shown formed in a silicon layer 101. Overlying the silicon layer 101 and metallization layer is an ILD layer 103 formed of dielectric materials. In a multi-layer structure, subsequent metallization layers are commonly formed on top of the ILD layer 103. In order to establish electrical connection between the layers, conductive vias can be used. Such vias can be formed by creating an opening 104 in the ILD layer 103 and then creating a conductive interconnect therein. In the depicted implementation, the opening 104 includes a metal barrier layer 105 formed on the walls of the opening. Additionally, such metal barrier layers 105 typically cover the underlying copper conducting line 102. Once the metal barrier layer 105 is formed, a copper interconnect (plug) 106 is typically deposited over the metal barrier layers 105 in the opening 104 to form a copper interconnect. The surface can then be planarized (e.g., using CMP) to prepare the surface for further processing. Such structures find wide usage and applicability in current semiconductor fabrication.

Such metal barrier layer and via structures are satisfactory for many applications. However, as critical dimensions decrease, especially below the 1$\mu$(micron) level, the proportion of space in the via occupied by the metal barrier layer 105 becomes greater and greater. This results in less room in the via for the highly conductive copper interconnect 106. Because copper is significantly more conductive than existing metal barrier layers, the overall conductivity of an interconnect is significantly reduced as the proportion of metal barrier layer material goes up. This is especially so in conductive vias having diameters of 1$\mu$ or less. Moreover, in existing processes the metal barrier layer 105 extends across the bottom of the via 105*b*. The interfaces between copper (e.g., 102 and 106) and the bottom portion 105*b* of the metal barrier layer are subject to a high incidence of failure.

Thus, for these and other reasons, there is a need for improvements in copper barrier layer structures.

SUMMARY OF THE INVENTION

In accordance with the principles of the present invention, a method and structure for forming a dielectric copper barrier layer are disclosed. One embodiment of the present invention is directed to an improved inter-layer conducting layer. Such a structure includes a semiconductor substrate having copper interconnect structures formed thereon. An overlying insulating layer is formed on the underlying copper interconnect structures. The insulating layer formed of a material that includes at least one of silicon and carbon. An opening is formed in the insulating layer to expose a portion of the underlying copper interconnect structure. The inner surface of the opening in the insulating layer has a dielectric barrier layer formed thereon to prevent the diffusion of copper into the insulating layer. A copper plug is formed to fill the opening and make electrical contact with the underlying copper interconnect structure.

Another embodiment comprises methods for forming copper interconnects with dielectric copper barrier layers. The method involves providing a substrate having copper interconnect structures and an insulating layer that overlies the copper interconnect structures formed thereon. The insulating layer has an opening that exposes an underlying copper interconnect structure and is configured to receive an inlaid conducting structure that is in electrical contact with the copper interconnect structure. The insulating layer is formed of a low-K dielectric material that includes at least one of silicon and carbon material. The method further involves forming a dielectric copper barrier layer on the inside surface of the opening to produce a barrier to copper diffusion into the insulating layer. The opening is then filled with copper material.

These and other aspects of the present invention are described in greater the detailed description of the drawings set forth herein below.

BRIEF DESCRIPTION OF THE DRAWINGS

The following detailed description will be more readily understood in ion with the accompanying drawings, in which:

FIG. 1 is a simplified figurative depiction of a semiconductor wafer in a process chamber.

FIG. 2 is a cross-section view of a portion of a semiconductor surface having a layer of conducting material, a barrier layer, and a layer of insulating material formed thereon, all in readiness for the formation of an ARC in accordance with principles of the present invention.

FIG. 3(*a*) is a simplified schematic cross-section view of the substrate having an opening in the insulating layer in readiness for further processing in accordance with the principles of the present invention.

FIG. 3(*b*) is a simplified figurative depiction of the substrate of FIG. 3(*a*) in a chamber during processing in accordance with the principles of the invention.

FIG. 3(*c*) is a simplified depiction of the substrate of FIG. 3(*a*) having a dielectric copper barrier layer constructed in accordance with an embodiment of the present invention.

FIG. 4(*a*) is a simplified figurative depiction of a substrate in a process chamber during processing in accordance with an embodiment of the invention.

FIG. 4(*b*) is a simplified depiction of the substrate of FIG. 3(*a*) having a dielectric copper barrier layer constructed in accordance with another embodiment of the present invention.

FIG. 5(*a*) is a simplified figurative depiction of a substrate in a process chamber during processing in accordance with an embodiment of the invention.

FIGS. 5(*b*)–5(*c*) are simplified cross-section views of a portion of a substrate surface having precursor sub-layers and dielectric copper barrier layers formed thereon in accordance with the principles of the invention.

It is to be understood that, in the drawings, like reference numerals designate like structural elements. Also, it is understood that the depictions in the Figures are not necessarily to scale.

DETAILED DESCRIPTION

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

In the following detailed description, various materials and method embodiments for forming dielectric copper barrier layers will be disclosed. Such dielectric copper barrier layers are comprised of materials that are dielectric in nature and also provide a barrier to the diffusion of copper materials. In particular, silicon oxycarbide, silicon carbide, and silicon carbide nitride can be used as dielectric copper barrier materials. Additionally, densified dielectric materials can be used as dielectric copper barrier layers. Methods constructing these and related dielectric copper barrier layers will be detailed. Silicon carbide, for purposes of this patent, is a generic name given to a class of materials comprising $Si_xC_y$. Also, silicon oxycarbide, for purposes of this patent, is a generic name given to a class of materials comprising $Si_xO_yC_z$.

As depicted in FIG. 2, the embodiments 200 begin by first providing a suitable substrate in readiness for processing in accordance with the principles of the invention. As used herein, substrate refers to a semiconductor substrate structure. Such structures can include, for example, the bare silicon surfaces of a wafer or any of the surfaces formed thereon. Additionally, such substrates are not confined to silicon-containing substrates but can include other materials (e.g., GaAs). Such substrates can also comprise multi-level semiconductor structures. In the depicted embodiment, the substrate includes a semiconductor substrate 201. The depicted embodiment includes a semiconductor substrate 201 having copper interconnect structures formed thereon 202. Over the semiconductor substrate 201 lies an overlying insulating layer 203 being formed of a material that includes at least one of silicon and carbon. The insulating layer 203 has an opening 204 that exposes the underlying copper interconnect structures 202. In preferred implementations the insulating layer 203 is formed of a low-K dielectric material. Many materials are suitable for use in accordance with the principles of the invention. A preferred class of materials includes organo-silicate glasses (OSG). Such materials can include without limitation, silicate organic glasses (SiOCH), silicon carbide (SiC) materials, and silicon oxycarbide materials (SiOC). However, other materials can be used. Example dielectric materials include silicon dioxide or combinations of silicon dioxide and other doped dielectrics (e.g., BPSG, PSG). Additionally, the principles of the present invention find particular utility when applied to use with low-K dielectric materials. Example materials can include, without limitation, spin-on and CVD inorganic or organic silicate materials such as silsesquioxanes, silicates, and siloxanes; and, mixtures, or blends, of organic polymers and spin-on glasses. Particular low-K materials include, but are not limited to: Black Diamond 1, Black Diamond 2, and Black Diamond 3 from Applied Materials (of Santa Clara, Calif.); Coral from Novellus Systems, Inc. (of San Jose, Calif.); Aurora from ASM International (of the Netherlands); Orion from Trikon Technologies (of the United Kingdom); AKD from JSR; XLK from Dow Corning (of Midland Mich.); and HOSP or Nanoglass from Honeywell, Inc. (of Morristown, HJ). This list of materials is not intended to be exhaustive but rather illustrative. Additionally, the principles of the present invention find utility when used with materials that incorporate micro-pores to enhance their low-K properties.

On the inner surfaces of the opening 204 a dielectric barrier layer 205 is formed. Once the dielectric barrier layer 205 is formed, a bulk copper layer can be deposited to form a copper interconnect (plug) 206 that is in electrical contact with the underlying copper interconnect structures 202. The dielectric barrier layer 205 is intended to prevent the diffusion of copper into the insulating layer. The methodologies and materials used for forming such dielectric barrier layers 205 are described in detail hereinbelow.

One approach for forming dielectric barrier layers is disclosed with respect to FIGS. 3(*a*)–3(*c*). The process begins by providing a suitable substrate. FIG. 3(*a*) depicts one example of a typical substrate 300. FIG. 3(*a*) is a cross-section view of a portion of the surface of the substrate 300. The depicted substrate has a semiconductor substrate surface 301 with copper interconnect structures 302 formed thereon. Such copper interconnect structures 302 can be formed using a wide range of techniques known to those having ordinary skill in the art. Such techniques can include, but are not limited to, single and double damascene processes. At least one overlying insulating layer 303 overlying the copper interconnect structures 302 is provided. The insulating layer 303 is configured having an opening 304 that exposes the underlying copper interconnect structure 302. The opening 304 is configured to receive an inlaid conducting structure that is in electrical contact with the top surface 302*t* of underlying copper interconnect structure 302. The insulating layer 304 is typically formed of a low-K dielectric material. In preferred embodiment the dielectric material includes at least one of silicon and carbon material. Preferred materials include silicate organic glasses and organo-silicate glasses. As has been previously noted, other materials can be used. The methodologies of the present invention are particularly advantageous when used with low-K dielectric layers enhanced with micro-porosities. The depicted substrate 300 can be formed using a number of methods known to persons having ordinary skill in the art.

The insulating layer 303 is then treated to form a dielectric copper barrier layer on the inside surface of the opening. This dielectric copper barrier layer is a dielectric material that provides a barrier to copper diffusion into the insulating layer. Once the dielectric copper barrier layer is formed the opening is filled with copper material to complete the interlayer electrical connection.

Methods of treating the insulating layer 303 to form a dielectric copper barrier layer will now be discussed. In one implementation, the insulating layer 303 is plasma treated to form a dielectric copper barrier layer. Referring to FIG. 3(*b*), the substrate 300 is then placed in a processing chamber 310 of a suitable process machine. Suitable machines include, but are not limited to, high-density plasma (HDP) machines, reactive ion etch (RIE) machines, electron beam machine, or downstream plasma machines. One example of satisfactory machine is a Trikon Omega (manufactured by Trikon Technologies, Inc. of the United Kingdom).

In one implementation, an inert gas (e.g., argon (Ar) or helium (He)) is flowed into the chamber 310 and ignited into a plasma 311. Such plasma is used with a very low bias voltage. Voltage sufficient to enable plasma to reach the bottom of the trenches and vias (e.g., opening 304) is all that is needed. In this implementation, low bias is used to prevent the plasma from excessively sputtering the copper at the bottom of the opening. Due to the substantially non-directional nature of such plasma, such plasmas are referred to herein as substantially anisotropic plasmas. These substantially anisotropic plasmas can be sustained by maintaining low bias voltages in the range of about 0–500V (volts). Preferred implementations maintain bias at less than about 100V. The plasma power is set in the range of about 200–1200 W (watts). Chamber pressures are maintained in the range of about 100 mTorr to about 4 Torr. Flow rates for the inert gases should be in the range of about 100 SCCM (standard cubic centimeters per minute) to about 10 lpm (liters per minute). Process temperatures in the chamber 310 should range from about room temperature to about 400° C. With a preferred range of process temperature being about 200–300° C., with a most preferred process temperature of about 300° C.

Such a process is extremely effective at treating many insulating layers to form dielectric copper barrier layers. The process is particularly advantageous for creating dielectric copper barrier layers in insulating layers constructed of dielectric materials having micro-pores formed therein. The use and formation of such micro-pores are a well-known means for enhancing the low-K properties of dielectric layers. Plasma treating dielectric layers can result in increased density of dielectric material at the treated surface. Such regions of increased density are referred to as "densified" dielectric layers. Densified materials are simply more dense than materials prior to treatment. For example, one common OSG dielectric material having micro-pores has a density of in the range of 1–1.5 g/cm$^3$ (grams per cubic centimeter). After treatment plasma treatment, surface regions of the OSG dielectric material have a density of greater than about 2 g/cm$^3$. Thus, such plasma treated dielectric material is said to be "densified". This substantial increase in density increases the dielectric layers resistance to copper diffusion into the dielectric material forming the balance of the dielectric layer. Thus, such densified dielectric material forms a dielectric copper barrier layer.

Although this process can be used to create a dielectric copper barrier layer in many insulating layers, the process is most advantageous when used in conjunction with insulating layers having micro-pores formed therein. Treatment with said plasma for about 15–100 seconds results in a dielectric copper barrier layer about 10 Å to about 200 Å thick. Such a process and the resulting layer are advantageous because such dielectric copper barrier layers are thin (on the order of about 10 Å to about 200 Å) and do not form part of the interconnect metal and so do not restrict the thickness of the copper interconnect. Additionally, the dielectric copper barrier layer does not form on the top surface (e.g., 302*t* of FIG. 3(*a*)) underlying copper layer at the bottom of an. Therefore, such a dielectric copper barrier layer does not degrade copper interconnect electrical performance. Thus, some of the advantages of the present implementation are the ability to form thicker copper interconnect structures and increased electrical performance in the copper interconnect structures.

FIG. 3(*c*) depicts one embodiment of the improved structure 320 featuring a dielectric copper barrier layer. FIG. 3(*c*) is a cross-section view of a portion of the surface of the substrate similar to that shown in FIG. 3(*a*). The depicted embodiment has a semiconductor substrate surface 301 with copper interconnect structures 302 formed thereon. The least one overlying insulating layer 303 includes an opening 304 that exposes the underlying copper interconnect structure 302. The opening 304 is plasma treated to form a dielectric copper barrier layer 321 on the insulating layer 303. The opening 304 is then filled with copper material to form the copper interconnect 322. This copper interconnect 322 can be formed using any of the conventional techniques used for forming such structures. Examples, include, but are not limited to, seed layer deposition, bulk copper deposition, and CMP. Further layers and structures can be formed on the surface depicted in FIG. 3(*c*).

With continued reference to FIGS. 3(*a*)–3(*c*), by plasma treating the dielectric insulating layer 303 certain other dielectric copper barrier layers 321 can be formed. For example, in dielectric layers 303 having oxygen and silicon in the layers, such plasma treatment reduces the amount of oxygen in the surface of such layers 303 resulting in dielectric copper barrier layers 321 having a higher concentrations of silicon carbide. This processing is particularly suitable for silicate organic glasses (SiOCH) and other organo-silicate glasses.

Another approach for forming dielectric barrier layers is disclosed with respect to FIGS. 3(*a*), 4(*a*) and 4(*b*). As before, the process begins by providing a suitable substrate. The substrate of FIG. 3(*a*) depicts one example of a suitable substrate 300. The depicted substrate has a semiconductor substrate surface 301 with copper interconnect structures 302 formed thereon. At least one insulating layer 303 overlying the copper interconnect structures 302 is provided. The insulating layer 303 is configured having an opening 304 that exposes the underlying copper interconnect structure 302. As before, the opening 304 is configured to receive an inlaid conducting structure that is in electrical contact with the top surface 302*t* of copper interconnect structure 302. The insulating layer 304 is typically formed of a low-K dielectric material. As before the dielectric material includes at least one of silicon and carbon material, preferably silicate organic glasses and organo-silicate glasses.

The insulating layer 303 is then treated with a reactive material to form a dielectric copper barrier layer on the inside surface of the opening. One type of reactive materials includes $H_2$, CO, $CH_4$, and in some conditions $CO_2$. When plasmas are formed of such materials they form “reactive” plasmas that react with the material of the insulating layer to form dielectric copper barrier materials that can act as copper diffusion barriers. Moreover, the reactive plasma treatment can act to densify the material of the insulating layer to form dielectric copper barrier materials. Thus, a dielectric copper barrier layer can be formed. Once the dielectric copper barrier layer is formed the opening is filled with copper material to complete the interlayer electrical connection.

Methods of treating the insulating layer 303 with reactive plasmas to form a dielectric copper barrier layer will now be discussed. Referring to FIG. 4(*a*), the substrate 300 is then placed in a processing chamber 401 of a suitable process machine. Suitable machines include, but are not limited to, high-density plasma (HDP) machines, reactive ion etch (RIE) machines, electron beam machine, or downstream plasma machines. Again, a satisfactory machine is a Trikon Omega.

In one implementation, a reactive gas (e.g., CO, $H_2$, $CH_4$, or $CO_2$) is introduced into the chamber 401 and ignited into a reactive plasma 402. Flow rates for the reactive gases should be in the range of about 100 SCCM to about 10 lpm, preferably about 2000 SCCM. The plasma is ignited using a power of in the range of about 200–1200 W, preferably in a range of about 500–600W. As before, the reactive plasma 402 is used with a very low bias voltage. A voltage sufficient to enable plasma to reach the bottom of the trenches and vias (e.g., opening 304) is all that is required to establish a satisfactory anisotropic reactive plasma. The low bias is used to prevent the plasma from excessively sputtering the copper at the bottom of the opening or excessively damaging the insulating layer 303. This plasma can be sustained by maintaining a low bias voltage of in the range of about 0–500V (volts), but preferably less than about 100V. Typically, chamber pressures are maintained in the range of about 100 mTorr to about 4 Torr. Process temperatures in the chamber 401 should range from about room temperature to about 400° C. With a preferred process temperature range of about 200–300° C., with a temperature of about 300° C. being most preferred.

Referring to FIG. 4(*b*), a dielectric copper barrier layer is formed. The ignited reactive plasma 402 is very effective at removing oxygen from the surface of the insulating layer 303. This is especially, true where the reactive gas includes $H_2$. As a result the concentration of silicon carbide is increased in the surface of the insulating layer 303 forming a dielectric copper barrier layer 415 on the inside surface the opening 304. Also, carbon containing reactive materials such as $CH_4$, CO, and $CO_2$ can increase the concentration of silicon carbide in the surface of the insulating layer 303 to form a dielectric copper barrier layer 415 on the inside surface the opening 304.

In a related embodiment, the reactive gas can comprise a nitrogen-containing material (e.g., NO, $N_2$, ammonia, or $NO_2$). The nitrogen-containing gas is introduced into the chamber 401 and ignited into a reactive plasma 402. Again similar flow rates can be used (e.g., in the range of about 100 SCCM to about 10 Ipm). The plasma can be ignited at a power in the range of about 200–1200 W, preferably about 500–600 W. As before, the nitrogen-containing reactive plasma 402 is used with a very low bias voltage to establish an anisotropic plasma. This plasma can be sustained by maintaining a low bias voltage of in the range of about 0–500 V (volts), but preferably less than about 100 V. Again, chamber pressures are maintained in the range of about 100 mTorr to about 4 Torr. Process temperatures in the chamber 401 should range from about room temperature to about 400° C. With a preferred process temperature range of about 200–300° C., with a temperature of about 300° C. being most preferred. Nitrogen-containing plasma can generate SiCN (silicon carbon nitrides) in the surface of the insulating layer 303 to form a dielectric copper barrier layer 415 on the inside surface the opening 304. Such SiCN rich dielectric copper barrier layers 415 function well as barriers to copper diffusion into the insulating layer 303.

An additional advantage of such reactive plasmas is that, like plasmas generated using inert materials, they can also densify the surface of the insulating layer 303 on the inside surface the opening 304 to form improved dielectric copper barrier layers 415. Thus, as discussed above, the process is particularly advantageous for creating dielectric copper barrier layers in insulating layers constructed of dielectric materials having micro-pores formed therein.

Exposing a insulating layer 303 to reactive plasma for about 15–100 seconds results in a dielectric copper barrier layer 415 of about 10 Å to about 200 Å thick. As before, the resulting layer are advantageous because such dielectric copper barrier layers are thin (on the order of about 10 Å to about 200 Å) and do not restrict the thickness of the copper interconnect. Additionally, unlike conventional processes the dielectric copper barrier layer does not form on the top surface 302*t* of the underlying copper layer. Once the dielectric copper barrier layer 415 is formed, the opening 304 is then filled with copper material to form the copper interconnect 416. This copper interconnect 416 can be formed using any of the conventional techniques used for forming such structures.

Yet another another approach for forming dielectric barrier layers is disclosed with respect to FIGS. 3(*a*), 5(*a*) and 5(*b*). This embodiment comprises forming one or more layers of dielectric copper barrier material over one another to form a suitable dielectric copper barrier layer. Again, the process begins by providing a suitable substrate such as that depicted and described with respect to FIG. 3(*a*). As depicted in FIG. 5(*a*), the substrate 300 is then placed in a processing chamber 501 of a suitable process machine. As before, suitable machines include, but are not limited to, high-density plasma (HDP) machines, reactive ion etch (RIE) machines, electron beam machine, or downstream plasma machines. Again, one satisfactory machine is a Trikon Omega.

Referring to FIGS. 5(*a*) and 5(*b*), in one implementation, a precursor gas 502 is flowed into the chamber 401 and deposited onto the inside surface of the opening 304 to form a precursor sub-layer 511. Some preferred precursor materials are methyl silanes, vinyl silanes, and methyl-vinyl silanes. For example, suitable precursor materials include compounds comprising $(R_{1x})(R_{2y})$ Si $H_z$ wherein $R_1$ consists of methyl groups (—$CH_3$), $R_2$ consists of vinyl groups (—CH=$CH_2$), H consists of hydrogen and wherein x is an integer from 0–4, y is an integer from 0–4, and z is an integer from 0–4. Specific examples include 4-methylsilane (Si $(CH_3)_4$, also known as 4MS), 3-methylsilane ($Si(CH_3)_3H$, also known as 3MS), 2-methylsilane ($Si(CH_3)_2H_2$, also known as 2MS), and also 1-methylsilane ($Si(CH_3)H_3$, also known as IMS). However, vinyl silanes are also suitable. Specific examples include, without limitation, $Si(C_2H_3)_4$, $Si(C_2H_3)_3H$, $Si(C_2H_3)_2H_2$, and $Si(C_2H_3)H_3$. Moreover, methyl-vinyl silanes can also be used. Typical examples of such methyl-vinyl silanes include, but are not limited to vinyl tri-methyl silane $(C_2H_3)(CH_3)_3$ Si, di-vinyl di-methyl silane $(C_2H_3)_2(CH_3)_2$ Si, tri-vinyl methyl silane $(C_2H_3)_3(CH_3)$ Si, and tetra-vinyl silane $(C_2H_3)_4$ Si as well as many other similar materials known to persons having ordinary skill in the art.

In one exemplar process, precursor materials 502 are flowed into the process chamber, typically with an inert carrier gas (e.g., argon (Ar) or helium (He)). Such precursor material deposits onto the inside of the opening 304 to form a precursor sub-layer 511. In one embodiment, the precursor gas is introduced into the chamber at a flow rate of about 100 SCCM to about 11 lpm. As the precursor materials are flowed into the process chamber, a pressure in the range of about 10 mTorr to about 2 Torr is maintained. A temperature of −100° C. to about 400° C. is maintained. A preferred temperature is in the range of about −30° C. to about 100° C. Under these conditions a precursor sub-layer 511 is formed on the inside of the opening 304. Such sub-layers 511 can be formed having very small thicknesses on the order of about 2–5 Å. The precursor materials are then evacuated from the chamber 503 of FIG. 5(*a*).

Once the chamber is evacuated, the precursor sub-layers are treated to generate a dielectric copper barrier sub-layer. In one embodiment, inert materials are introduced to the chamber 501 after the precursor materials are evacuated from the chamber. The inert materials are ignited into a plasma. Such materials include, but are not limited to argon and helium. The plasma is ignited using a power of in the range of about 200–800 W. Once formed, the plasma is used with a very low bias voltage. Bias voltages in the range of about 0–500V (volts) can be used with voltages less than about 100V being preferred. This forms an anisotropic plasma which is used to change the precursor sub-layer 511 into a dielectric copper barrier sub-layer. During such process chamber pressures are maintained in the range of about 100 mTorr to about 2 Torr. Flow rates for the inert gases should also be in the range of about 100 SCCM to about 10 lpm, with flow rates in the range of 1–2 lpm being preferred. Process temperatures in the chamber 501 should range from about −30° C. to about 400° C. With a preferred process temperature of about 100° C. to about 300° C. As indicated, the plasma treatment reacts with the precursor sub-layer 511 to form a dielectric copper barrier sub-layer. It should be noted that the precursor sub-layer 511 can be treated in other ways to form a dielectric copper barrier sub-layer. Such treatment can comprise treatment with a low intensity electron beam or exposure to photons (e.g., UV radiation) to form a dielectric copper barrier sub-layer. Additionally, heating can be used to form a dielectric copper barrier sub-layer. Typically, such treatment forms a form a dielectric copper barrier sub-layer formed of silicon carbide materials. In an alternative embodiment, the inert gases 502 can be replaced by carbon monoxide or $O_2$ gas which is ignited into plasma which then reacts the precursor sub-layer 511 to form a dielectric copper barrier sub-layer. A dielectric copper barrier sub-layer formed in this manner commonly includes silicon oxycarbide. In yet another implementation, the inert gas 502 can be replaced by a nitrogen-containing material which is ignited into plasma which then reacts the precursor sub-layer 511 to form a dielectric copper barrier sub-layer. A dielectric copper barrier sub-layer formed in this manner commonly includes SiCN. Suitable nitrogen-containing materials include, $N_2$, NO, $NO_2$, with $N_2$ being preferred. In some implementations, the precursor materials can form on the exposed top portion 521*t* underlying copper interconnect structure 521. In such cases the bias voltage is increased to sputter the precursor and/or dielectric copper barrier material off the underlying copper interconnect structure 521.

Once the dielectric copper barrier sub-layer formed. The forgoing process can be repeated to form additional precursor sub-layers which are reacted to form additional dielectric copper barrier sub-layers over the underlying dielectric copper barrier sub-layers. One such embodiment is depicted in FIG. 5(*c*). The initial substrate is much the same as depicted and described with respect to FIG. 3(*a*). A semiconductor substrate 301 having a copper interconnect structure 302 formed thereon is depicted. A plurality of dielectric copper barrier sub-layers 531, 532, and 533 are formed on the inside surface of the opening 304 in the insulating layer 303. The several dielectric copper barrier sub-layers 531, 532, and 533 collectively form a final dielectric copper barrier layer 534. Final dielectric copper barrier layers 534 are typically formed to thicknesses ranging from about 20 Å to about 300 Å. Such layers are typically, formed using a plurality of 2 Å thick sub-layers.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. Further, reference in the claims to an element in the singular is not intended to mean "one and only one" unless explicitly stated, but rather, "one or more".

What is claimed is:

1. A method for forming a dielectric copper barrier layer, the method comprising:

providing a substrate having formed thereon an insulating layer having formed therein an opening configured to receive an inlaid copper structure, the insulating layer being formed of a material that includes at least one of silicon and carbon; and treating the insulating layer so that a dielectric copper barrier layer is formed on the inside surface of the opening thereby producing a barrier to copper diffusion into the insulating layer wherein said treating includes:

depositing precursor materials selected from the group consisting of vinyl tri-methyl silane $(C_2CH_3)(CH_3)_3$ Si, di-vinyl di-methyl silane $(C_2H_3)_2(CH_3)_2$ Si, tri-vinyl methyl silane $(C_2H_3)_3(CH_3)$ Si, and tetra-vinyl silane $(C_2H_3)_4$Si onto the insulating layer to form a precursor sub-layer on the insulating layer including on the surfaces of the inside of the opening in the insulating layer;

plasma treating the precursor materials with an inert plasma; and repeating the operations of depositing the precursor materials and plasma treating the precursor materials to add additional dielectric copper barrier sub-layers onto to the underlying dielectric copper barrier sub-layers until a final dielectric copper barrier layer is formed having a desired thickness.

2. The method of claim 1 wherein the insulating layer comprises a low-K dielectric material.

3. The method of claim 2 wherein the insulating layer further comprises having a plurality of microporosities formed therein.

4. The method of claim 1 wherein, prior to depositing the precursor materials onto the insulating layer to form a precursor sub-layer, the insulating layer is pre-treated with a plasma in order to increase the adhesion of the insulating layer to a subsequently deposited sub-layer of precursor material.

5. The method of claim 1 wherein the operations of plasma treating the precursor sub-layers include plasma treating the sub-layers to densify the sub-layers.

6. The method of claim 1 wherein the operations of plasma treating comprise plasma treating the precursor sub-layers to form silicon carbide (SiC) sub-layers.

7. The method of claim 1 wherein treating the precursor materials with an inert plasma comprises treating the precursor materials with at least one of a helium plasma and an argon plasma.

* * * * *